(12) United States Patent
Chigullapalli et al.

(10) Patent No.: US 12,259,280 B1
(45) Date of Patent: Mar. 25, 2025

(54) APPARATUS PROVIDING LIQUID TEMPERATURE DATA FROM INDIVIDUAL DIRECT COLD PLATE COOLING UNITS

(71) Applicant: ZT Group Int'l, Inc., Secaucus, NJ (US)

(72) Inventors: Sruti Chigullapalli, Secaucus, NJ (US); Lauren Ficek, Secaucus, NJ (US); Brian Pilapil, Secaucus, NJ (US); Karan Mehta, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 339 days.

(21) Appl. No.: 17/856,582

(22) Filed: Jul. 1, 2022

(51) Int. Cl.
| | |
|---|---|
| *G01K 1/14* | (2021.01) |
| *G01K 1/02* | (2021.01) |
| *G01K 1/024* | (2021.01) |
| *G01K 13/02* | (2021.01) |
| *H05K 7/20* | (2006.01) |

(52) U.S. Cl.
CPC ............... *G01K 1/14* (2013.01); *G01K 1/024* (2013.01); *G01K 1/026* (2013.01); *G01K 13/026* (2021.01); *H05K 7/20209* (2013.01); *H05K 7/20254* (2013.01)

(58) Field of Classification Search
CPC .......... G01K 1/14; G01K 1/024; G01K 1/026; G01K 13/026; H05K 7/20209; H05K 7/20218; H05K 7/20272; H05K 7/20281; H05K 7/20254; G01D 11/30
See application file for complete search history.

(56) References Cited

U.S. PATENT DOCUMENTS

| | | | |
|---|---|---|---|
| 2013/0138253 A1* | 5/2013 | Chainer | H05K 7/20781 700/282 |
| 2016/0091938 A1* | 3/2016 | Edwards | G06F 1/3215 700/300 |
| 2017/0089496 A1* | 3/2017 | Lennon | F16L 13/146 |
| 2021/0333046 A1* | 10/2021 | Cleland | F25D 31/002 |

FOREIGN PATENT DOCUMENTS

WO WO-2012049765 A1 * 4/2012 .............. F28F 27/00

* cited by examiner

*Primary Examiner* — Benjamin R Schmitt
(74) *Attorney, Agent, or Firm* — Dergosits & Noah LLP; Todd A. Noah

(57) ABSTRACT

An apparatus and system provide coolant temperature data at the individual electronic device level, e.g., for a single server blade, using thermally conductive couplers positioned in-line with one or both of the fluid inlet and outlet tubes and temperature sensors in thermal contact with the couplers. Thus, provided with granular coolant temperature data at the device level, the cooling system, e.g., fan and/or pump speeds, may be controlled with the same level of granularity, thereby improving both temperature control and the conservation of energy.

20 Claims, 10 Drawing Sheets

APPARATUS PROVIDING LIQUID TEMPERATURE DATA FROM INDIVIDUAL DIRECT COLD PLATE COOLING UNITS

FIELD OF THE INVENTION

The present subject matter relates generally to cooling systems and more specifically to determining the temperature of coolant of individual cooling units within a cooling system.

BACKGROUND

In a typical arrangement, direct cold plate servers are deployed in a rack and cooled with a Coolant Distribution Unit (CDU) that is either liquid to liquid, or liquid to air. The CDU has access to liquid inlet and outlet temperatures at rack level but lacks access to data at the individual server level.

Without individual server coolant temperature data, it becomes difficult to optimize a number of functions. First, it is difficult to accurately adjust for temperature differences between individual server blades, which may result in some servers overheating and some servers overcooling. Second, it is more difficult to design and execute algorithms for pump and fan speeds to control liquid inlet temperatures. And third, it is more difficult to validate thermal simulations with test results at baseline (time zero) and runtime (weeks, months, and years from initial deployment).

Thus, what is needed is an apparatus that provides coolant temperature data at the server blade level.

BRIEF DESCRIPTION OF THE DRAWINGS

The embodiments are illustrated by way of example and not limitation in the accompanying drawings, in which like references indicate similar elements, and in which.

DETAILED DESCRIPTION

Figure 1A:
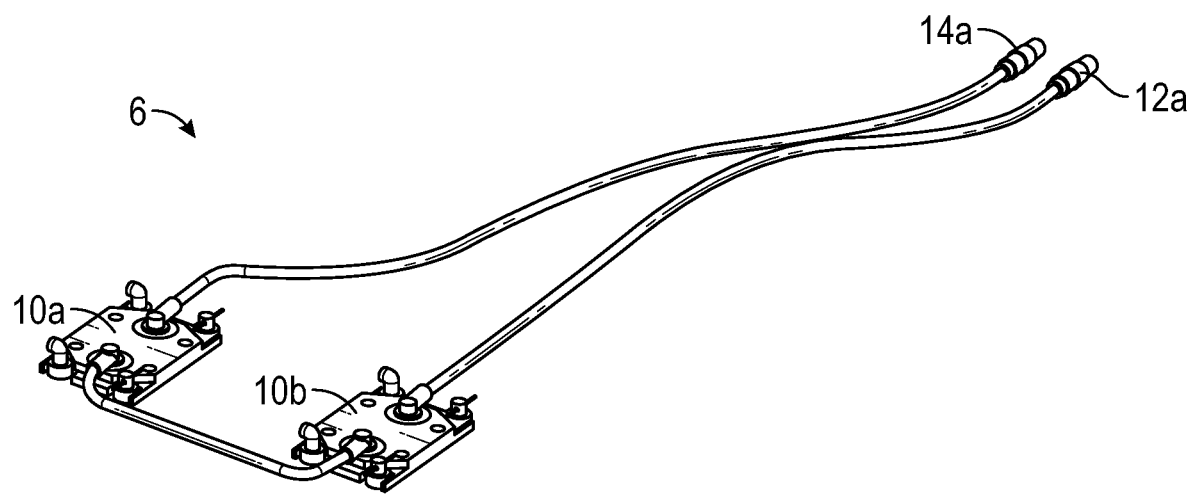
FIG. 1A is an upper front right isometric view of prior art cooling units in series.

Embodiments described within disclose an apparatus and system that provide coolant temperature data at the individual electronic device level, e.g., for a single server blade, using one or more of: a) thermally conductive, e.g., copper, couplers that are positioned in-line with liquid inlet and outlet tubes without having to create holes in any of the fluid lines; b) sensors in thermal contact with the coupler, and perhaps positioned on the motherboard, that provide temperature telemetry; and c) an algorithm that aggregates data on inlet and outlet temperatures and predict failures such as: cold plate fin fouling, coolant flow mal-distribution, and leaks. Embodiments may be used to sense the temperatures of liquid coolant fluids, liquid heating fluids, gaseous coolant fluids, and gaseous heating fluids.

Thus, an embodiment may provide for coolant temperature telemetry at blade level using an apparatus that collects the temperature data for an individual coolant loop without having to create holes in any coolant line. In an embodiment, the temperature sensors are also not in contact with the coolant so corrosion of the sensor is not a concern. And the placement of the sensors is not affected by the CPUs being in series or parallel.

Thus, embodiments provide granularity to the coolant temperature data. Granularity facilitates implementing a number of features.

Granularity in the coolant temperature data allows the user to manage pump and fan speeds in the CDU more precisely. That is, instead of trying to control the temperatures of multiple servers using temperature data from only the CDU outlet (going to the server coldplates) and inlet (received from the server coldplates), with granularity in the coolant data (i.e., temperature sensors at each coldplate), the user can control the CDU outlet temperature based on temperature data from the outlet of a single coldplate. This allows changing the CDU fluid outlet temperature to address issues developing at an individual server. For example, a simulation was performed modeling nineteen blade servers, each fitted with a separate coldplate. In the simulation, liquid temperatures were monitored at the inlet and outlet of the coldplates as well as the CDU. In a first condition, all servers were placed under worst-case stress, causing them to generate worst case heat. From a CDU outlet temperature of 45° C. and with the pump at 48% rpm (resulting in 0.7 LPM/cpu coolant flow), the stressed server heated the coolant to 52° C. With all nineteen servers being similarly stressed, the CDU inlet temperature was the same 52° C. In a second condition, only a single server was stressed, which heated the 45° C. coolant to 59° C. with the pump at 25% rpm (resulting in 0.4 LPM/cpu coolant flow). However, with only one of nineteen servers being stressed, the CDU inlet temperature was only raised to 48° C. Thus, using only CDU inlet and outlet temperatures, the system did not know that the server was overheating and did not respond by increasing pump rpm. In a third condition, a single stressed server heated 37° C. coolant to 44° C. with the pump at 48% rpm (as in first condition with 0.7 LPM/cpu coolant). Here, the CDU inlet temperature was 38° C. and the stressed server output temperature was 44° C., indicating it was being overcooled. But without individual server temperature data, the CDU could not response by reducing the coolant flow appropriately. In another example, a test was performed using the apparatus with nineteen blade servers, each fitted with a separate coldplate. One coldplate was equipped with inlet and outlet temperature sensors, as was the CDU. When the server associated with the sensor-equipped coldplate was changed from an idle to a stressed condition, the temperature rise at the CDU inlet was five times slower than the temperature rise at the coldplate outlet.

Heat will be lost between the CDU exit and the server inlet through various paths, such as the hoses, manifolds, copper fittings, and cold plate surfaces. Thus, even with a coldplate system, the server blade fan speed can still have an effect on coolant temperature. That is, increasing the fan speed may still decrease the temperature inside the coldplate. While trying to control the coolant temperature in the coldplates through the server blade fans can be inefficient, the coldplate effectiveness may be changed based on fan speed. With granular temperature data a user may control an individual server fan associated with a particular server blade to influence the amount of heat transferred from the coolant through the various paths and thereby has another way to control the temperature of the coolant reaching that server blade inlet.

Granularity in the coolant temperature data may be used to detect unit-to-unit variability, which may, e.g., result from manufacturing differences. Thus, detecting unit-to-unit variation may be referred back to the unit vendor and result in quality improvements.

Granularity in the coolant temperature data may detect runtime a blade-to-blade variation in temperature indicative of a coolant maldistribution issues. Thus, detecting unit-to-unit variation may detect a congestion or fouling in one or more blades, a potential fluid leak, or variations in flow due to distance of different servers from the pump.

FIG. 1A is an upper front right isometric view of prior art cooling units in series. FIG. 1A illustrates a serial arrangement 6 of cold plates 10a, 10b in which coolant fluid flows into an inlet 12a, through cold plate 10b, through cold plate 10a, and through outlet 14a.

Figure 1B:
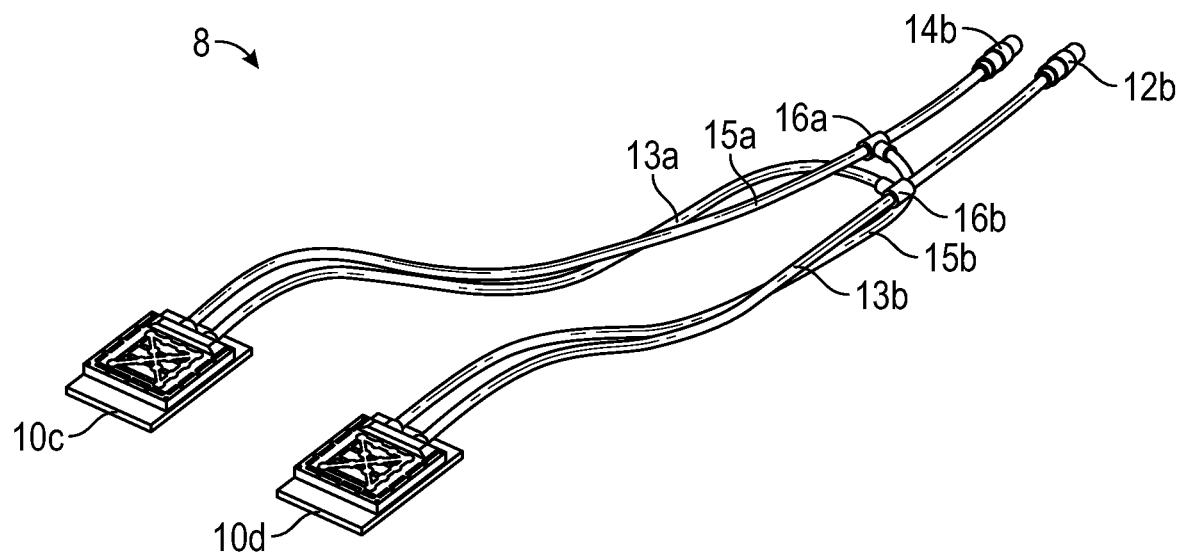
FIG. 1B is an upper front right isometric view of prior art cooling units in parallel.

FIG. 1B is an upper front right isometric view of prior art cooling units in parallel. FIG. 1B illustrates a parallel arrangement 8 of cold plates 10c, 10d in which coolant fluid flows into an inlet 12b, is divided at a T-connector 16b, flows through cold plates 10c and 10d, returns to and is re-united at a T-connector 16a, and flows through outlet 14b.

Figures 2A, 2B:
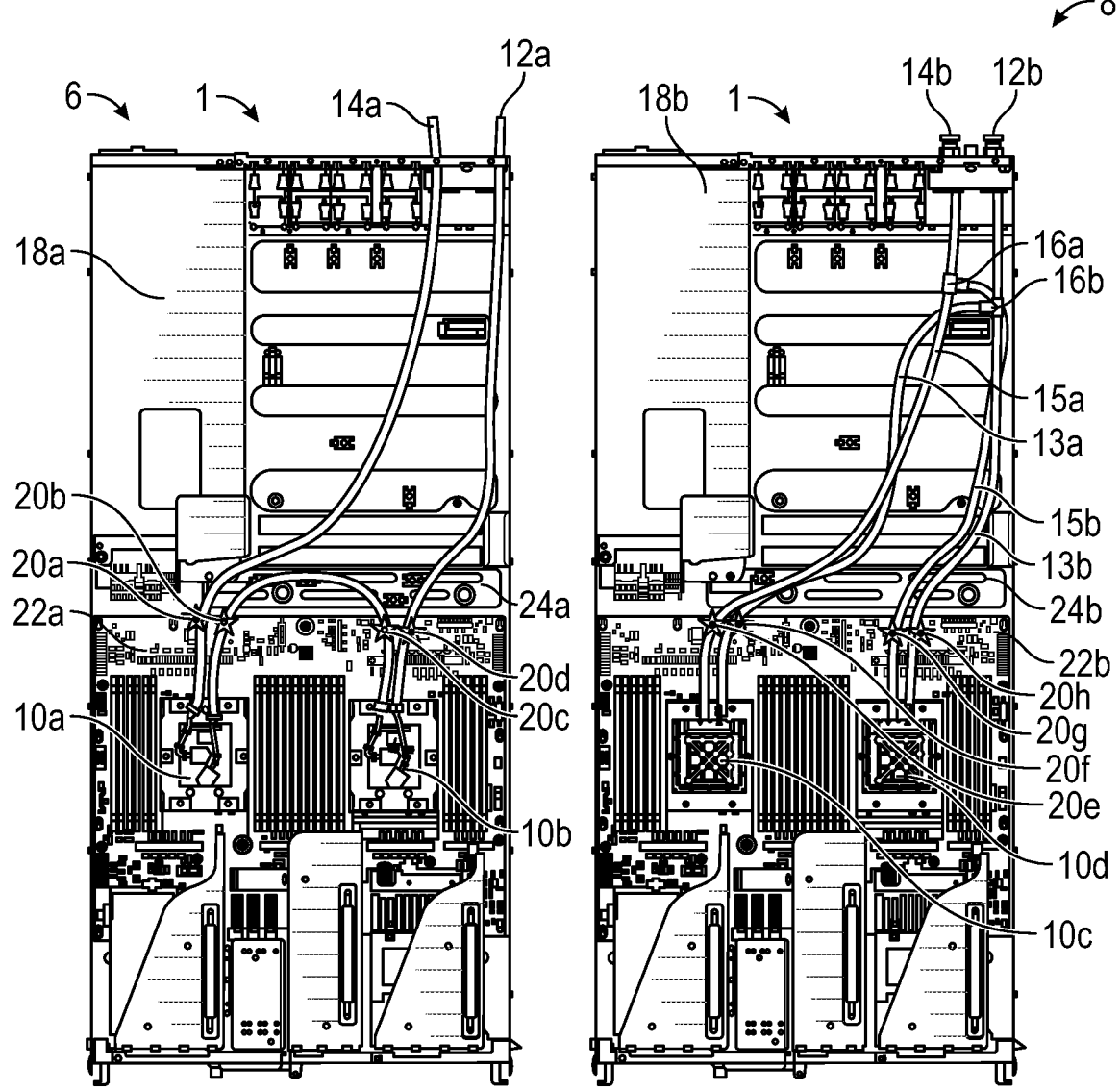
FIG. 2A is a top view illustrating aspects of an embodiment of a mechanism providing liquid temperature data from individual direct cold plate cooling units.
FIG. 2B is a top view illustrating aspects of an embodiment of a mechanism providing liquid temperature data from individual direct cold plate cooling units.

FIG. 2A is a top view illustrating aspects of an embodiment of an apparatus 1 providing liquid temperature data from individual exemplary direct cold plate cooling units of an exemplary electronic device, a server blade. In FIG. 2A, apparatus 1 is provided on a server 18a with serial cold-plate arrangement 6. Server 18a includes a motherboard 22a, and an attached server plate 24a. Sensor locations 20a . . . 20d indicate positions in the flow path of serial arrangement 6 at which temperature is sensed by apparatus 1, that is: sensor location 20a senses the temperature of the coolant flow from the outlet of cold plate 10a through a fluid hose 14a; sensor location 20b senses the temperature of the coolant flow at the inlet of cold plate 10a through a fluid hose joining cold plates 10a, 10b; sensor location 20c senses the temperature of the coolant flow from the outlet of cold plate 10b through the fluid hose joining cold plates 10a, 10b; and sensor location 20c senses the temperature of the coolant flow to the inlet of cold plate 10b through a fluid hose 12a.

In an embodiment, with serial configuration 6, sensor locations 20b and 20c may be considered to provide essentially the same temperature data, and in such an embodiment, a single sensor location 20b or 20c may be employed to provide: the temperature of coolant flow from the outlet of cold plate 10b; and the temperature of coolant flow into the inlet of cold plate 10a.

In an embodiment, with serial configuration 6 or with a single cold plate, sensor locations 20a and 20d may be used to provide data for the entire electronic device 18a, namely: from location 20a, the temperature of coolant flow from the outlet of device 18a; and from location 20d, the temperature of coolant flow into device 18a.

FIG. 2B is a top view illustrating aspects of an embodiment in which apparatus 1 for providing liquid temperature data from individual exemplary direct cold plate cooling units of an exemplary electronic device, a server blade with parallel cooling plate arrangement 8. In FIG. 2B, apparatus 1 is provided on a server 18b with parallel cold plate arrangement 8. Server 18b includes a motherboard 22b, and an attached server plate 24b. Sensor locations 20c . . . 20h indicate positions in the flow path of parallel arrangement 8 at which temperature is sensed by apparatus 1, that is: sensor location 20e senses the temperature of the coolant flow from the outlet of cold plate 10c through a fluid hose 15a; sensor location 20f senses the temperature of the coolant flow at the inlet of cold plate 10c through a fluid hose 13a; sensor location 20g senses the temperature of the coolant flow from the outlet of cold plate 10d through a fluid hose 15b; and sensor location 20h senses the temperature of the coolant flow to the inlet of cold plate 10d through a fluid hose 13b.

In an embodiment, with serial configuration 8 or with a single cold plate, sensor locations 20c and 20f, or locations 20g and 20h, may be used to provide data representing the entire electronic device 18b, for example: from location 20e, the temperature of coolant flow from the outlet of device 18b; and from location 20f, the temperature of coolant flow into device 18b.

In an embodiment, with serial configuration 8 or with a single cold plate, a sensor may be located between outlet 14b and T-connector 16a and a sensor may be located between inlet 12b and T-connector 16b to provide data representing the entire electronic device 18b, for example: the temperature of coolant flow from outlet 14b, and the temperature of coolant flow into inlet 12b.

Figure 3A:
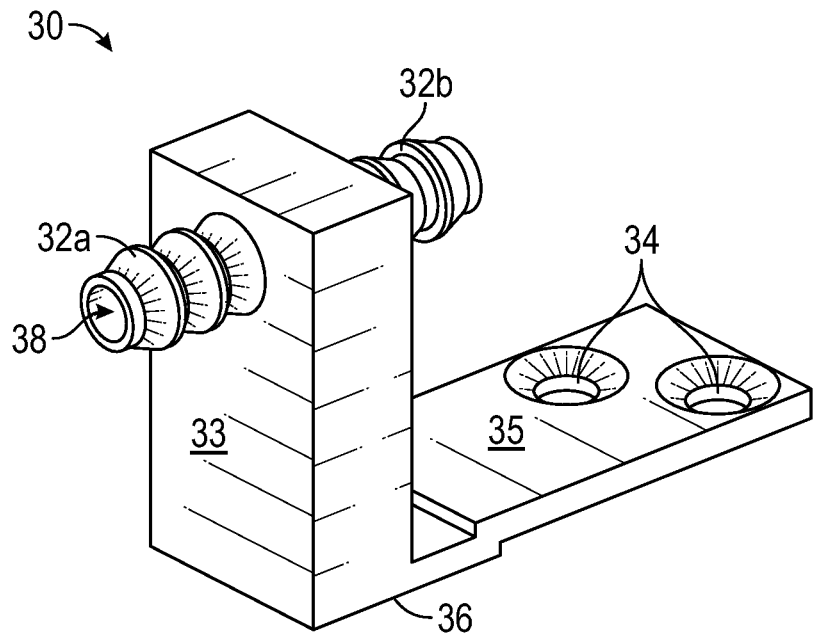
FIG. 3A an upper front right isometric view of aspects of an embodiment of a mechanism providing liquid temperature data from individual direct cold plate cooling units.
Figure 3B:
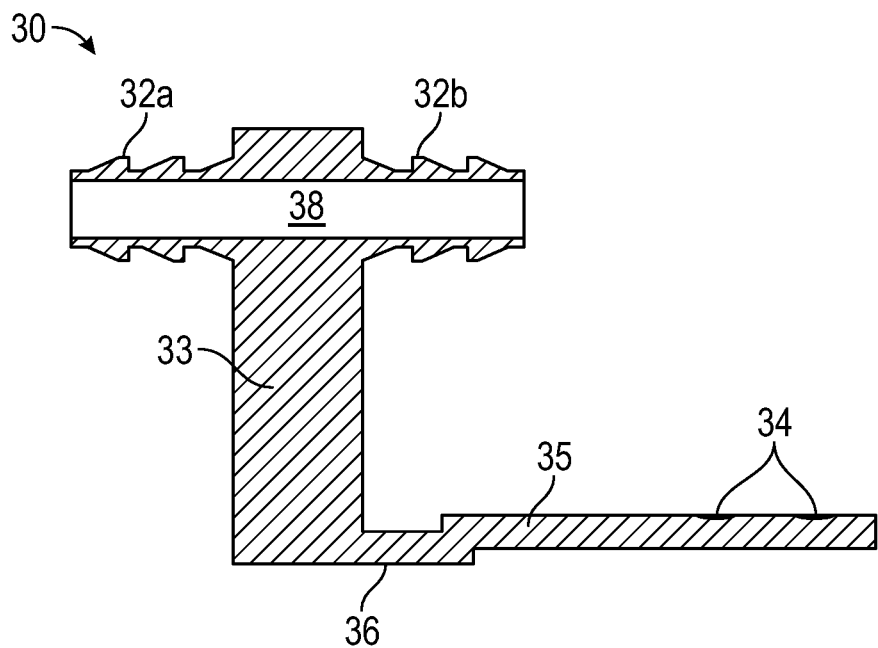
FIG. 3B is a side view of the apparatus of FIG. 3A.

FIG. 3A an upper front right isometric view of aspects of an embodiment of an apparatus 1 for providing liquid temperature data from individual direct cold plate cooling units. In FIG. 3A, a fluid fitting 30 includes a bore 38 providing a flow path between barb fittings 32a, 32b. In embodiments, fitting 30 is a thermally conductive material such that fluid flowing through bore 38 heats, or conducts heat from, fitting 30 such that a change in the temperature of fluid flowing through bore 38 causes a change in the temperature of fitting 30. Fitting 30 may include: a pedestal 33 between barb fittings 32a. 32b and a base 36; and a mounting flange 35 with mounting holes 34. FIG. 3B is a side view of the apparatus of FIG. 3A and further illustrates bore 38. Fitting 30 may be used for both liquid and gaseous fluids.

Figure 4:
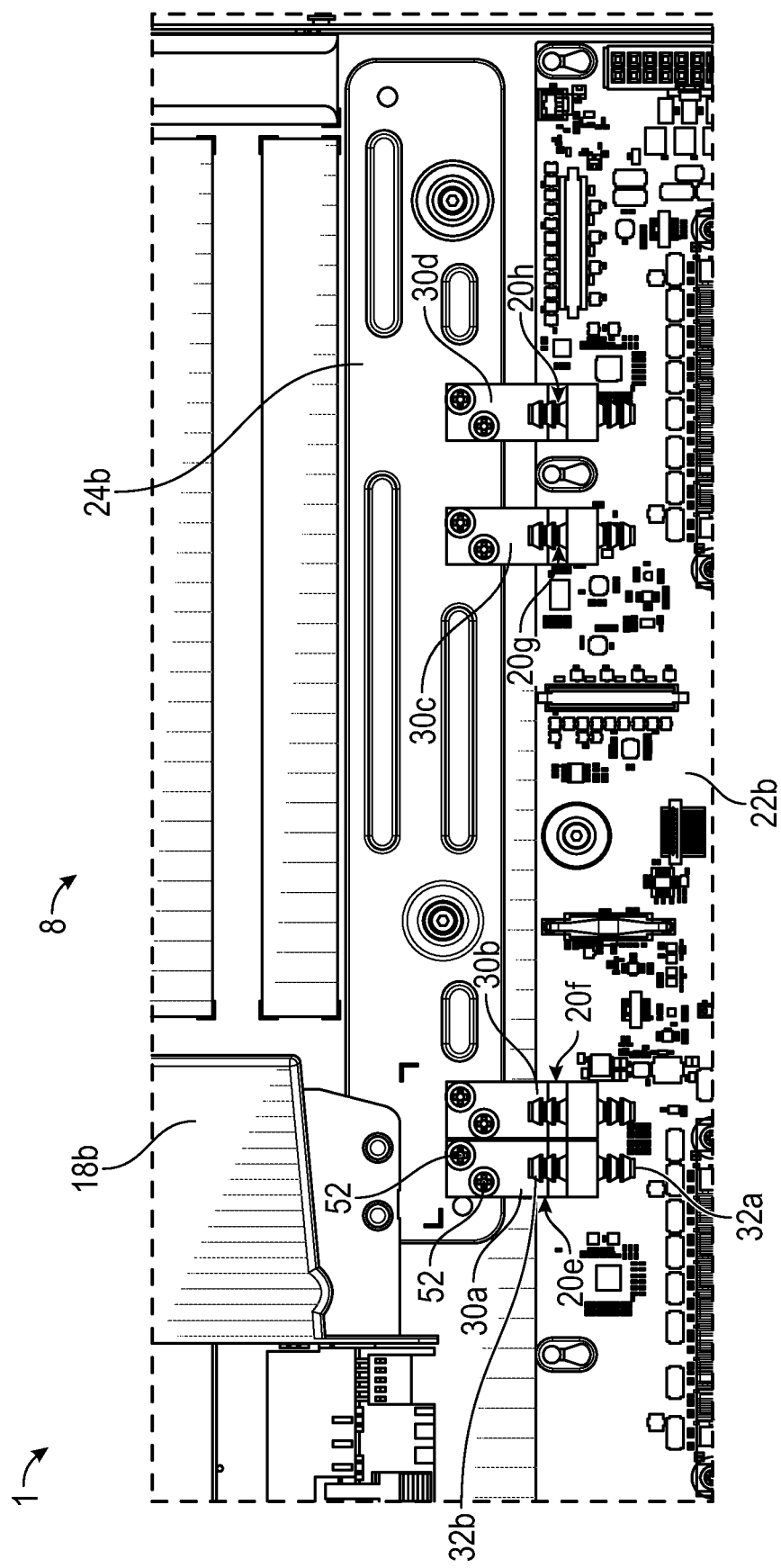
FIG. 4 is a top view illustrating aspects of an embodiment of a mechanism providing liquid temperature data from individual direct cold plate cooling units.

FIG. 4 is a top view illustrating aspects of an embodiment of an apparatus 1 for providing liquid temperature data from individual direct cold plate cooling units. In FIG. 4, fittings 30a . . . 30d, each identical to fitting 30 of FIG. 3A, are shown attached to plate 24b using fasteners 52 through flanges. Fittings 30a . . . 30d are situated at locations 20c . . . 20h, respectively, such that each base 36 is above motherboard 22b. The arrangement in FIG. 4 is shown with respect to parallel cold plate configuration 8, but, until coolant hoses are attached to fittings 30a . . . 30d, is equally representative of the installation of fittings 30 on plate 24a and motherboard 22a of serial configuration 6. In an embodiment, plates 24a, 24b may be added to the chassis of servers 18a, b to support fixtures 30a . . . 30d.

Figure 5:
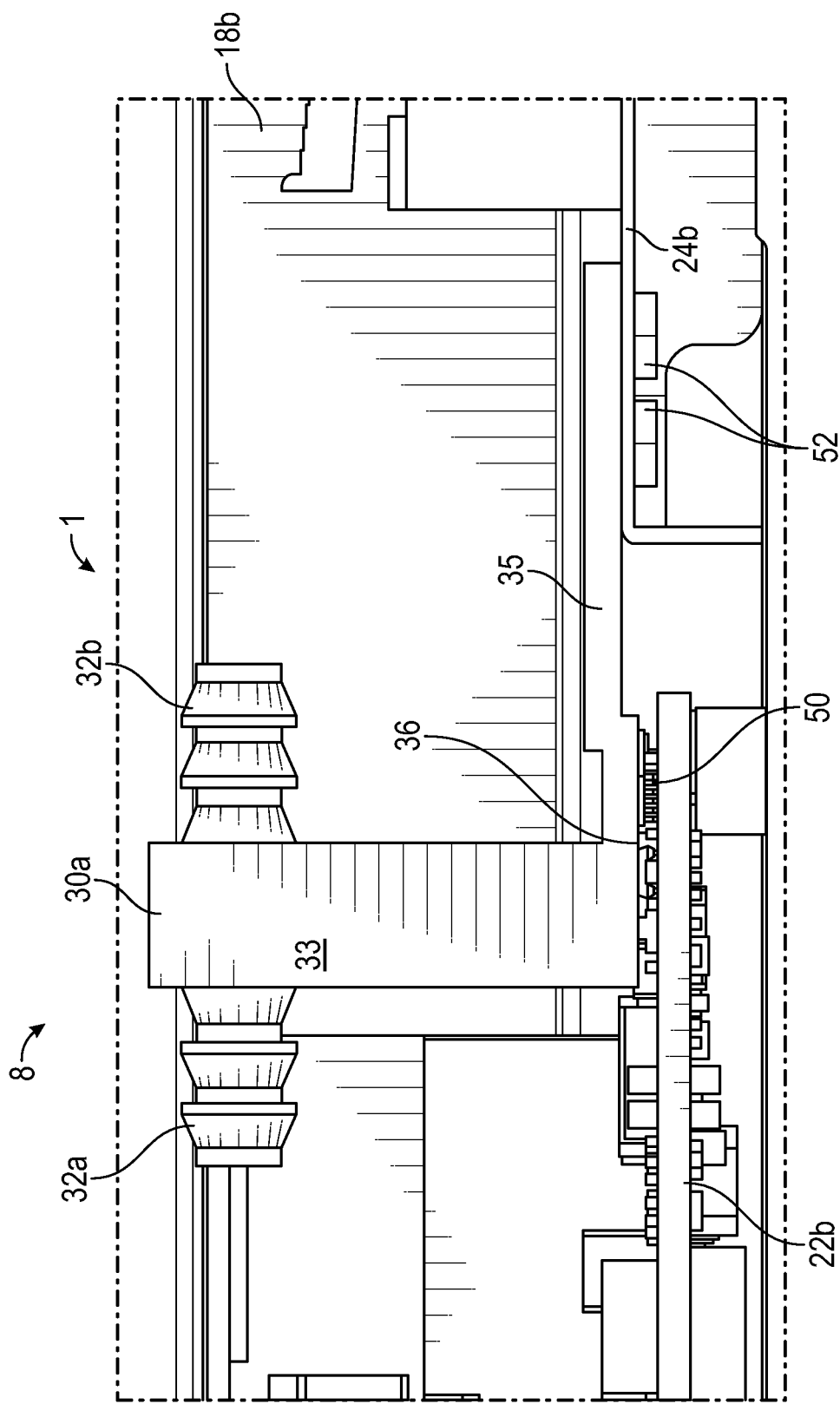
FIG. 5 is a side view of details of the apparatus of FIG. 4.

FIG. 5 is a side view of details of the apparatus of FIG. 4. FIG. 5 illustrates fitting 30a and fittings 30b . . . 30d are similarly arranged. Fitting 30a includes a temperature sensor 50 thermally connected to base 36. In an embodiment, sensor 50 may be hardwired to motherboard 22b such that a temperature of base 36 sensed by sensor 50 may be communicated through motherboard 22b and related network connections for processing. In an embodiment, sensor 50 may include wiring separate from motherboard 22b to communicate the temperature of base 36 through network connections for processing. And in an embodiment, sensor 50 may be provided with a wireless connection to communicate the temperature of base 36 through network connections for processing.

Figure 6:
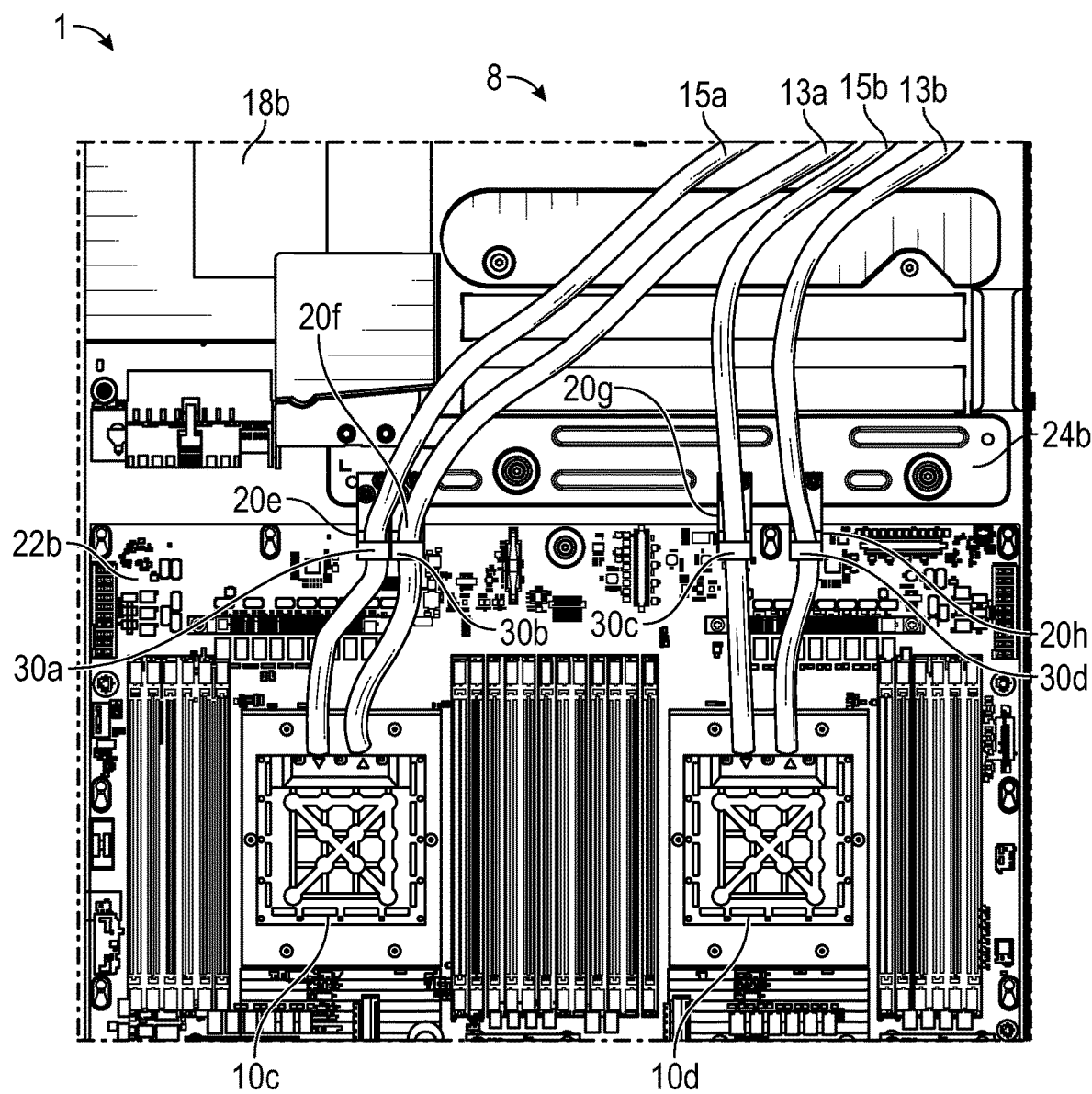
FIG. 6 is a top view illustrating aspects of an embodiment of a mechanism providing liquid temperature data from individual direct cold plate cooling units.

FIG. 6 is a top view illustrating aspects of an embodiment of an apparatus 1 for providing liquid temperature data from individual direct cold plate cooling units. In FIG. 6, fittings 30a . . . 30d are shown inserted in-line with fluid hoses 15a, 13a, 15b, and 13b, respectively. Thus, with fluid flowing though bores 38 of fittings 30a . . . 30d, for each fitting, temperature changes in the fluid are communicated through pedestal 33 to sensor 50 at base 36. In this manner, the temperature detected by each sensor 50 may be considered representative of the temperature of the fluid flowing through the respective bore 38.

FIG. 6 illustrates that fittings 30a . . . 30d may be provided in hoses 15a, 13a, 15b, and 13b by cutting the respective hose at the appropriate distance from the cold plate, attaching fittings 30a . . . 30d at locations 20e . . . 20h, respectively, and securing the divided hoses to barb fittings 32a, 32b of the appropriate fittings. As a result, each hose is connected to each fitting 30 using a barb fitting 32a, 32b, which is considered preferable by being more leak proof and secure than if each hose had been punctured to insert a temperature sensor.

In embodiments, temperatures sensed by sensor 50 may be considered equivalent to the temperature of the fluid flowing through bore 38. In embodiments, temperatures sensed by sensor 50 may be considered indicative of the temperature of the fluid flowing through bore 38. In other words, there may be a discrepancy between fluid temperature and sensor temperature if, e.g.: the thermal interface material between base 36 and sensor 50 is not spread evenly or at the optimized thickness; or sensor 50 is being residually heated by other components on the motherboard. As part of a solution validation, a correlation may be developed between temperatures registered by sensor 50 and actual liquid temperatures passing through bore 38.

In embodiments, bore 38 may be modified, e.g., made convoluted or serpentine, to increase the correspondence between the temperature sensed at sensor 50 and the temperature of fluid flowing through bore 38.

In embodiments, pedestal 33 may be modified, e.g., made shorter, or of less material, or of a more thermally conductive material, to increase the correspondence between the temperature sensed at sensor 50 and the temperature of fluid flowing through bore 38.

Figure 7:
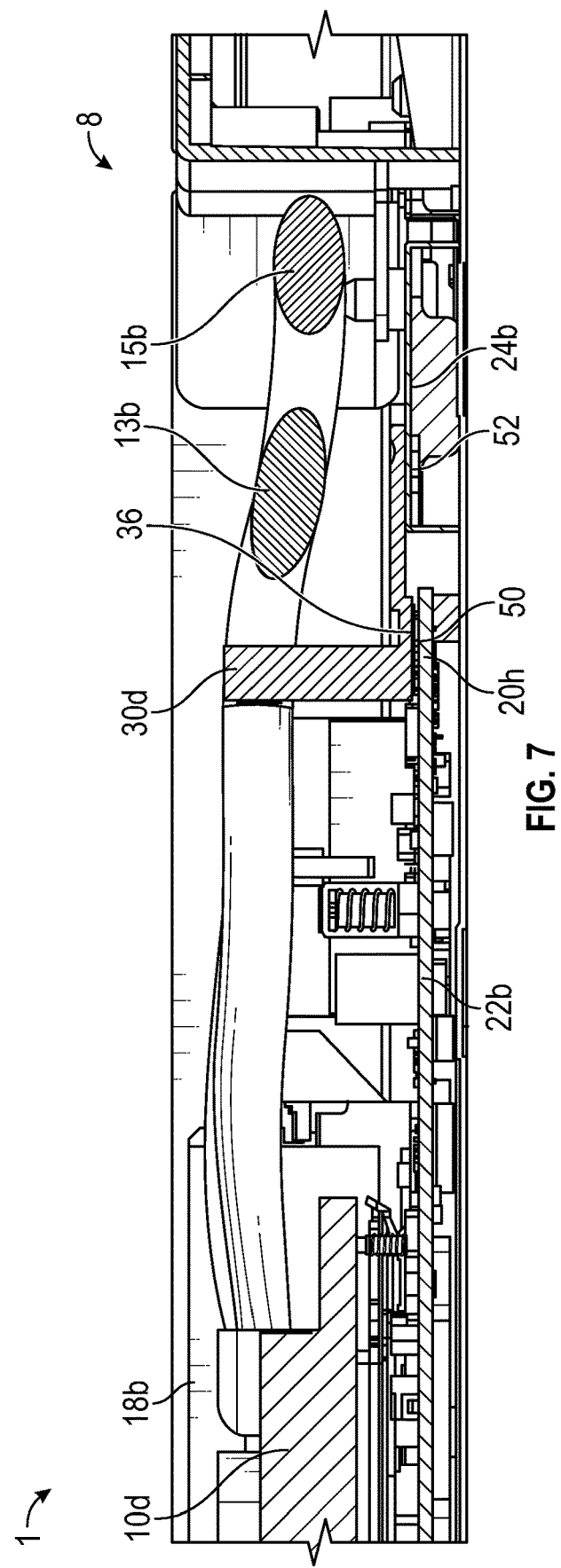
FIG. 7 is a side view of details of the apparatus of FIG. 6.

FIG. 7 is a side view of details of the apparatus of FIG. 6. In FIG. 7, hose 13b is shown severed with fitting 30d connected between the severed hose sections by barbs 32a, 32b (FIG. 5). The temperature of fluid flowing through hose 13b thereby changes the temperature of fitting 30d that is sensed by sensor 50.

The subject matter discloses a system and apparatus providing granular temperature data for individual elements of an electronic device, e.g., data for each cold-plate of a server blade. Such data facilitates methods for controlling the cooling system based on data from individual devices within the system. In an embodiment, a temperature measurement of at least one fluid fitting may be received, and an output of a cooling system of the computer components may be controlled based on the received temperature measurement. Examples of components upon which fluid-cooling devices may be mounted include, but are not limited to, the central processing unit (CPU), a graphics processing unit (GPU), an in-line memory module (e.g., a dual in-line memory module), a storage drive (e.g., a hard drive), and a peripheral component interconnect express (PCIe) card.

Based on the received temperature readings, an output of the cooling system, e.g., a fan setting and/or a fluid flow setting, may be controlled based on the received temperature reading from the individual cooling unit.

In some embodiments, temperature data from sensors 50 may be read in one of many ways known to one of skill, including, e.g., firmware executing on a networked device, and an external measurement device. Furthermore, while the discussion above related primarily to airflow flowing over liquid cold-plate cooling systems. The same concepts may be applied to airflow flowing over closed-system, forced-air cooling systems.

Figure 8:
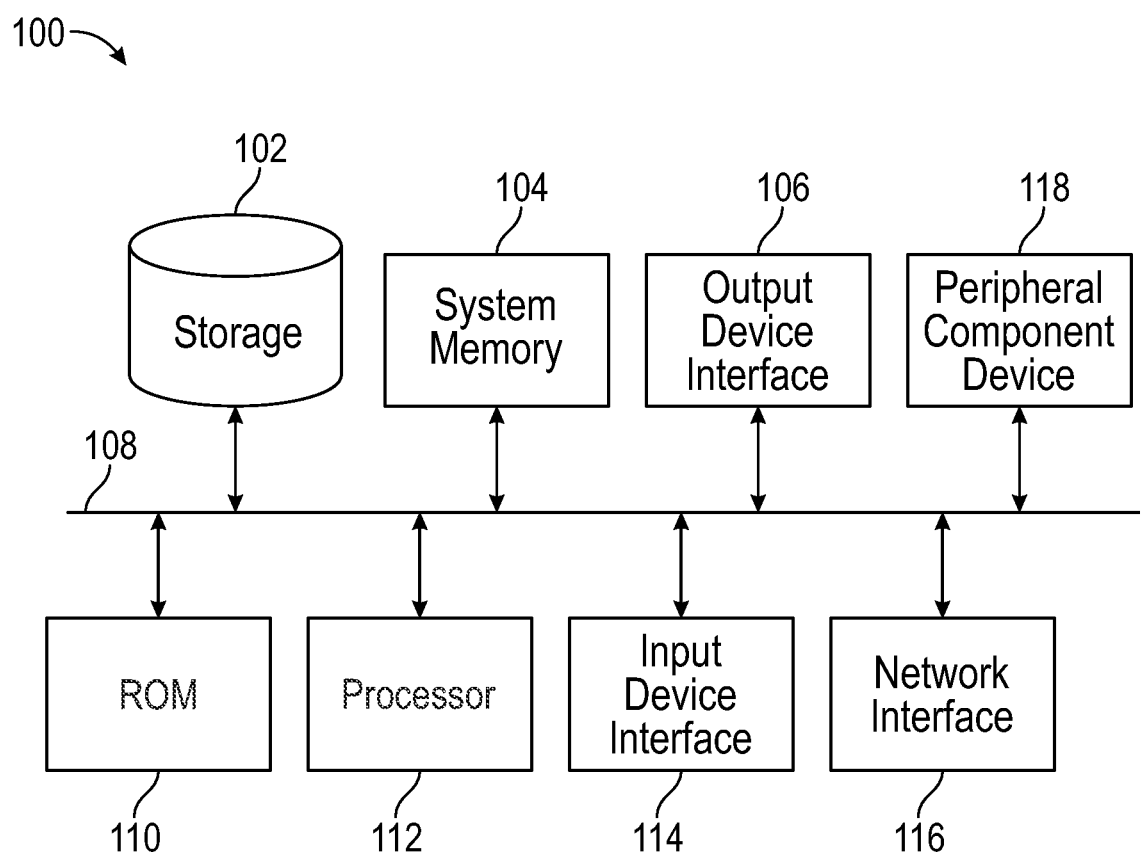
FIG. 8 is a conceptual illustration of an example electronic system with which some implementations of the subject technology may be implemented.

FIG. 8 is a conceptual illustration of an example electronic system 100 with which some implementations of the subject technology may be implemented. Those of ordinary skill in the art will appreciate that the elements illustrated in FIG. 8 may vary depending on the system implementation. Electronic system 100 can be a computer or a server. Such an electronic system may include various types of computer readable media and interfaces for various other types of computer readable media. Electronic system 100 includes a bus 108, processing unit(s) 112, a system memory 104, a read-only memory (ROM) 110, a permanent storage device 102, an input device interface 114, an output device interface 106, a network interface 116 and peripheral component device(s) 118. Data from sensors 50, 150 (FIG. 10) may be received by system 100 over one or more of input device interface 114, network interface 116 and bus 108. Control signals from processor 112 may be communicated over one or more of network interface 116 and bus 108, to control fan controls or fluid controls associated with the temperature data received from sensors 50, 150.

Bus 108 collectively represents all system, peripheral, and chipset buses that communicatively connect the numerous internal devices of electronic system 100. For instance, bus 108 communicatively connects processing unit(s) 112 with ROM 110, system memory 104, permanent storage device 102 and peripheral component device(s) 118. In an embodiment, processing unit(s) 112 may be the central processing unit (CPU), and system memory 104 may be a dual in-line memory module (DIMM). Furthermore, peripheral component device(s) 118 may be connected to bus 108 via a peripheral component interconnect express (PCIe) card (not shown).

From these various memory units, processing unit(s) 112 retrieves instructions to execute the processes of the subject disclosure (e.g., receipt of the granular temperature data, processing of the temperature data, and control of the component cooling system based on the processed temperature data). The processing unit(s) can be a single processor or a multi-core processor in different implementations.

ROM 110 stores static data and instructions that are needed by processing unit(s) 112 and other modules of the electronic system. Permanent storage device 102, on the other hand, is a read-and-write memory device. This device is a non-volatile memory unit that stores instructions and data even when electronic system 100 is off. Some implementations of the subject disclosure use a mass-storage device (such as a magnetic, solid state, or optical disk and its corresponding disk drive) as permanent storage device 102.

Other implementations use a removable storage device (such as a floppy disk, flash drive, and its corresponding disk drive) as permanent storage device 102. Like permanent storage device 102, system memory 104 is a read-and-write memory device. However, unlike storage device 102, system memory 104 is a volatile read-and-write memory, such as random access memory. System memory 104 stores some of the instructions and data that the processor needs at runtime. In some implementations, the processes of the subject disclosure are stored in system memory 104, permanent storage device 102, and/or ROM 110. From these various memory units, processing unit(s) 112 retrieves instructions to execute and data to process in order to execute the processes of some implementations. For example, the various memory units include instructions for receiving temperature data, determining the temperature of the respective cooling units, and determining a control signal for the respective cooling units based on the received temperature data.

Bus 108 also connects to input and output device interfaces 114 and 106. Input device interface 114 enables the user to communicate information and select commands to the electronic system. Input devices used with input device interface 114 include, for example, alphanumeric keyboards and pointing devices (also called "cursor control devices"). Output device interface 106 enables, for example, the display of images generated by the electronic system 100. Output devices used with output device interface 106 include, for example, printers and display devices, such as cathode ray tubes (CRT) or liquid crystal displays (LCD). Some implementations include devices such as a touchscreen that functions as both input and output devices.

Finally, as shown in FIG. 8, bus 108 also couples electronic system 100 to a network (not shown) through a network interface 116. In this manner, the computer can be a part of a network of computers, such as a local area network, a wide area network, or an Intranet, or a network of networks, such as the Internet. Any or all components of electronic system 100 can be used in conjunction with the subject disclosure.

Figure 9:
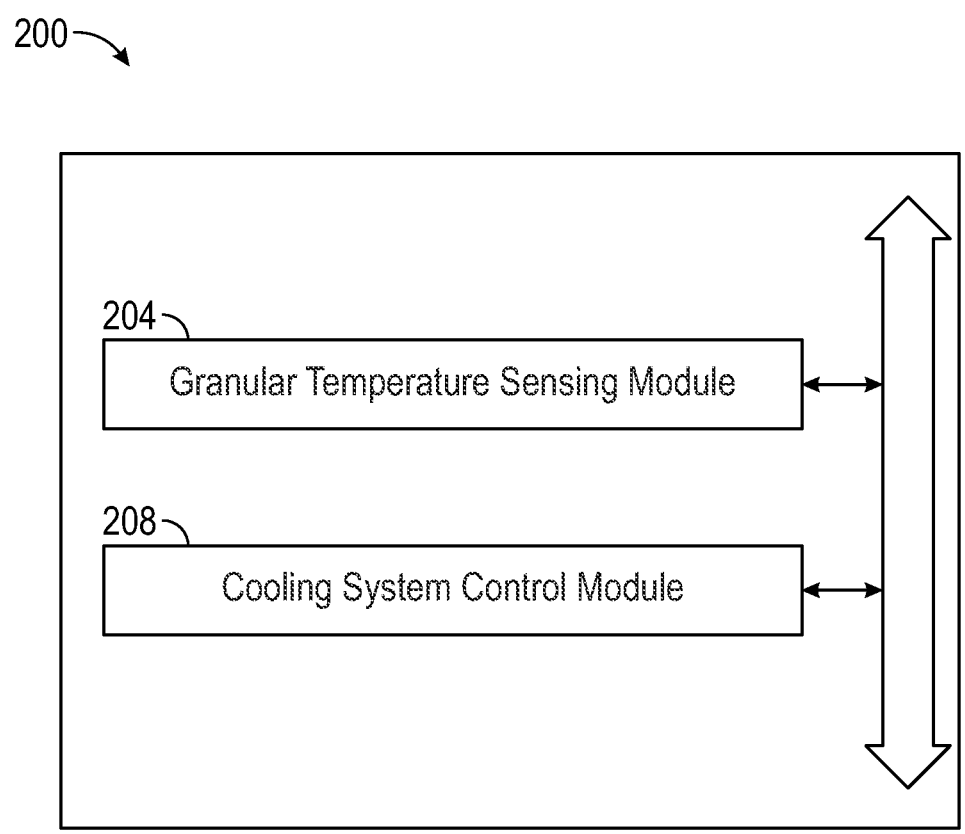
FIG. 9 is an illustration of an example system for controlling a cooling system.

FIG. 9 is an illustration of an example system for controlling a cooling system. System 200 includes granular temperature sensing module 204 and cooling system control module 208. These modules, which are in communication with one another, process information retrieved from components connected to bus 108 such as system memory 104, processing unit(s) 112, peripheral component device(s) 118, and network interface 116, in order to produce a command for the cooling system. For example, granular temperature data may be received by granular temperature sensing module 204 from any or all of the components connected to network interface 116.

Figure 10:
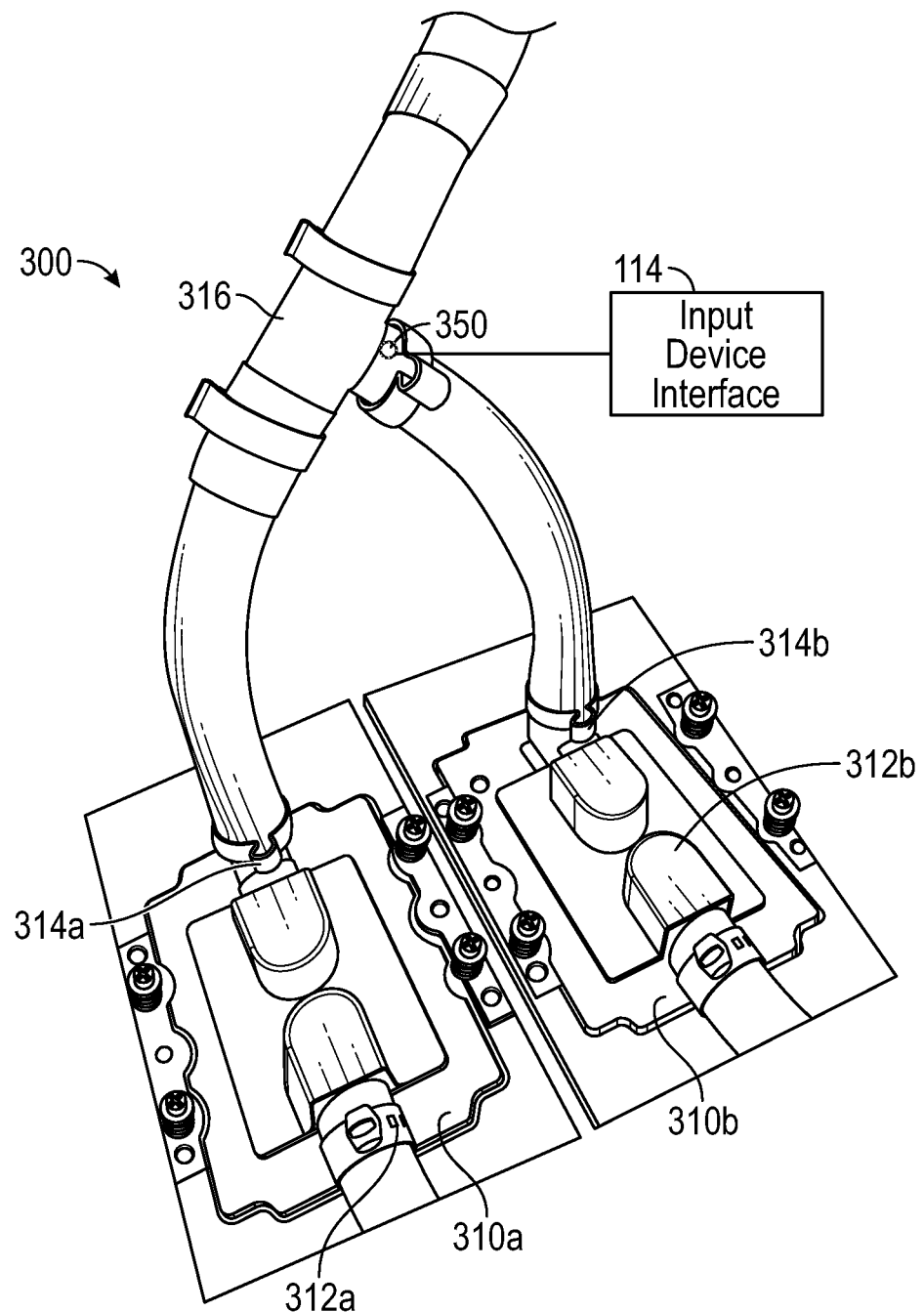
FIG. 10 is an illustration of an embodiment of a mechanism providing liquid temperature data from individual direct cold plate cooling units.

FIG. 10 is an illustration of an embodiment of an apparatus 300 providing liquid temperature data from individual direct cold plate cooling units. In FIG. 10, mechanism 300 is provided for coldplates 310a, 300b, each with fluid inputs 312a, 312b, and fluid outputs 314a, 314b. Mechanism 300 includes a thermocouple 350 and a t-connector 316, with thermocouple 350 sensing the temperature of fluid connector 316, which is made of a thermally conductive material, e.g., brass. Fluid connector 316 joins the fluid from coldplate outputs 314a, 314b. The previous description of sensor 50 applies equally to sensor 350. For example, sensor 350 may be hardwired to a motherboard such that a temperature of t-connector 316 sensed by sensor 350 may be communicated through the motherboard and related network connections for processing. In an embodiment, sensor 350 may include wiring separate from the motherboard to communicate the temperature of t-connector 316 through network connections for processing. And in an embodiment, sensor 350 may be provided with a wireless connection to communicate the temperature of t-connector 316 through network connections for processing. In an embodiment, sensor 350 may be provided on an in-line connector (not shown). In an embodiment, apparatus 300 may be provided on a coldplate input, e.g., input 312a, 312b.

When the granular temperature has been received, cooling system control module 208 processes the received information and sends a signal to control the output of the cooling system of the computer components. For example, if the granular temperature data indicate an increase in temperature for one or more of the components of the system, cooling system control module 208 may send a signal to increase the output of the cooling system for the respective components. An increase in output may result in the activation of a cooling fan, or an increase in the fan speed of the cooling fan, or an activation of a fluid flow, or an increase in the flow rate. Thus, cooling system control module 208 may adjust the output of the cooling system based on information received from granular component temperature sensing module 204. Furthermore, the information received from the modules may be measurements taken from any one or more of the components connected to bus 108.

In some aspects, the modules may be implemented in software (e.g., subroutines and code). The software implementation of the modules may operate on web browsers running on electronic system 100. In some aspects, some or all of the modules may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a first hydraulic fitting comprising a pedestal having a first flow path through a first end of the pedestal, the pedestal having a first integrated protrusion at an inlet of the flow path and a second integrated protrusion at an outlet of the flow path, the pedestal further having an integrated mounting flange extending from a second end of the pedestal at a distance from the first flow path; and
a first temperature sensor thermally connected to the first hydraulic fitting and configured to sense a first hydraulic fitting temperature.

2. The apparatus of claim 1, further comprising a first connection between the first temperature sensor and a network.

3. The apparatus of claim 2, wherein the first connection is a wireless connection.

4. The apparatus of claim 2, wherein the first fitting temperature is interpreted on the network as a first fluid temperature.

5. The apparatus of claim 4, further comprising a first flange attached to the first fitting and configured to connect to a plate.

6. The apparatus of claim 5, wherein the first temperature sensor is thermally connected to the first hydraulic fitting at a base of the first hydraulic fitting.

7. The apparatus of claim 6, wherein the first temperature sensor is electrically connected to a printed circuit board and the connection between the first sensor and the network is through the printed circuit board.

8. The apparatus of claim 4, further comprising a cold plate including an inlet and an outlet fluidically connected with the first flow path.

9. The apparatus of claim 8, further comprising a first controller of a first fluid flow through the first flow path, wherein the first controller is controlled by a first signal adjusted based at least in part on the first fitting temperature.

10. The apparatus of claim 9, further comprising:
a second hydraulic fitting provided with a second flow path;
a second temperature sensor thermally connected to the second hydraulic fitting and configured to sense a second fitting temperature; and
a second connection between the second temperature sensor and the network, wherein:
the first fluid flow passes through the first flow path into the inlet and from the outlet through the second flow path; and
the first signal is adjusted based at least in part on the first fitting temperature and the second fitting temperature.

11. The apparatus of claim 9, further comprising a second controller of a fan configured to cause an airflow over the cold plate, wherein the second controller is controlled by a second signal adjusted based at least in part on the first fitting temperature.

12. The apparatus of claim 11, further comprising:
a second hydraulic fitting provided with a second flow path;
a second temperature sensor thermally connected to the second hydraulic fitting and configured to sense a second fitting temperature; and
a second connection between the second temperature sensor and the network, wherein:
the first fluid flow passes through the first flow path into the inlet and from the outlet through the second flow path;
the first signal is adjusted based at least in part on the first fitting temperature and the second fitting temperature; and
the second signal is adjusted based at least in part on the first fitting temperature and the second fitting temperature.

13. The apparatus of claim 8, further comprising a second controller of a fan causing an airflow over the cold plate, wherein the second controller is controlled by a second signal adjusted based at least in part on the first fitting temperature.

14. The apparatus of claim 13, further comprising:
a second hydraulic fitting provided with a second flow path;
a second temperature sensor thermally connected to the second hydraulic fitting and configured to sense a second fitting temperature; and
a second connection between the second temperature sensor and the network, wherein:
the first fluid flow passes through the first flow path into the inlet and from the outlet through the second flow path; and
the second signal is adjusted based at least in part on the first fitting temperature and the second fitting temperature.

15. A kit capable of being added to an apparatus to measure a temperature of a fluid of the apparatus, the kit comprising:
a first hydraulic fitting comprising a pedestal having a first flow path through a first end of the pedestal, the pedestal having a first integrated protrusion at an inlet of the flow path and a second integrated protrusion at an outlet of the flow path, the pedestal further having an integrated mounting flange extending from a second end of the pedestal at a distance from the first flow path; and
a first temperature sensor thermally connected to the first hydraulic fitting and configured to sense a first hydraulic fitting temperature.

16. The kit of claim 15, further comprising a first wireless connector configured to create a first connection between the first temperature sensor and a network.

17. The kit of claim 15, further comprising a first flange attached to the first fitting and configured to connect to a plate.

18. The kit of claim 15, wherein the first temperature sensor is thermally connected to the first hydraulic fitting at a base of the first hydraulic fitting.

19. The kit of claim 15, wherein the apparatus includes a cold plate including an inlet and an outlet and the first flow path is connected to the inlet or outlet when the kit is added to the apparatus.

20. The kit of claim 19, wherein the apparatus includes a first controller of a first fluid flow and, when the kit is added to the apparatus, the first controller is controlled by a first signal adjusted based at least in part on the first fitting temperature.

\* \* \* \* \*